(12) United States Patent
Huang et al.

(10) Patent No.: US 9,660,414 B2
(45) Date of Patent: May 23, 2017

(54) HEAT DISSIPATION SYSTEM FOR OPTICAL MODULE

(71) Applicant: Huawei Technologies Co., Ltd., Shenzhen (CN)

(72) Inventors: Shuliang Huang, Shenzhen (CN); Mingliang Hao, Shenzhen (CN); Zaomeng Liu, Shenzhen (CN)

(73) Assignee: Huawei Technologies CO., Ltd., Shenzhen (CN)

( * ) Notice: Subject to any disclaimer, the term of this patent is extended or adjusted under 35 U.S.C. 154(b) by 0 days.

(21) Appl. No.: 14/948,558

(22) Filed: Nov. 23, 2015

(65) Prior Publication Data

US 2016/0079729 A1    Mar. 17, 2016

Related U.S. Application Data

(63) Continuation of application No. PCT/CN2013/086195, filed on Oct. 30, 2013.

(30) Foreign Application Priority Data

May 24, 2013   (CN) .......................... 2013 1 0196273

(51) Int. Cl.
*H01S 5/024*      (2006.01)
*H05K 1/02*       (2006.01)
(Continued)

(52) U.S. Cl.
CPC ........ *H01S 5/02469* (2013.01); *H01L 41/081* (2013.01); *H01L 41/09* (2013.01);
(Continued)

(58) Field of Classification Search
CPC .. H01S 5/02469; H01S 5/02208; H01S 5/022; H01S 5/02248
See application file for complete search history.

(56) References Cited

U.S. PATENT DOCUMENTS

2002/0167978 A1   11/2002   Nomoto
2005/0254537 A1   11/2005   Su et al.
(Continued)

FOREIGN PATENT DOCUMENTS

CN    200947716 Y    9/2007
CN    101662922 A    3/2010
(Continued)

OTHER PUBLICATIONS

Partial English Translation and Abstract of Chinese Patent Application No. CN101998801, Nov. 3, 2015, 4 pages.
(Continued)

*Primary Examiner* — Dung Nguyen
(74) *Attorney, Agent, or Firm* — Conley Rose, P.C.

(57) ABSTRACT

A heat dissipation system for an optical module, related to communication fittings technologies, is provided to improve heat dissipation efficiency of the optical module. The heat dissipation system for an optical module includes a circuit card on which at least one optical module is mounted, where the optical module includes a housing and a laser disposed inside the housing. A first heat dissipation apparatus is fixedly disposed on the circuit card. A heat dissipation window is provided in an area that is above the laser and on the housing of the optical module. The first heat dissipation apparatus performs heat dissipation on the heat dissipation window.

11 Claims, 3 Drawing Sheets

(51) Int. Cl.
*H01L 41/08* (2006.01)
*H01L 41/09* (2006.01)
*H01S 5/022* (2006.01)

(52) U.S. Cl.
CPC .......... *H01S 5/022* (2013.01); *H01S 5/02208* (2013.01); *H05K 1/0209* (2013.01); *H01S 5/02248* (2013.01); *H01S 5/02407* (2013.01); *H05K 2201/10121* (2013.01)

(56) References Cited

U.S. PATENT DOCUMENTS

| | | | |
|---|---|---|---|
| 2007/0257981 A1* | 11/2007 | Hitz | B41J 2/45 347/237 |
| 2011/0259557 A1 | 10/2011 | Chao et al. | |
| 2013/0253487 A1* | 9/2013 | Liu | A61B 18/203 606/9 |
| 2014/0178220 A1 | 6/2014 | Fujisaki et al. | |
| 2014/0346661 A1 | 11/2014 | Liu et al. | |

FOREIGN PATENT DOCUMENTS

| | | |
|---|---|---|
| CN | 101998801 A | 3/2011 |
| CN | 102046978 A | 5/2011 |
| CN | 102508341 A | 6/2012 |
| CN | 202733845 U | 2/2013 |
| CN | 103052289 A | 4/2013 |
| CN | 103117275 A | 5/2013 |

OTHER PUBLICATIONS

Partial English Translation and Abstract of Chinese Patent Application No. CN200947716, Nov. 3, 2015, 4 pages.
Foreign Communication From a Counterpart Application, PCT Application No. PCT/CN2013/086195, English Translation of International Search Report dated Feb. 27, 2014, 2 pages.
Foreign Communication From a Counterpart Application, PCT Application No. PCT/CN2013/086195, English Translation of Written Opinion dated Feb. 27, 2014, 7 pages.
Foreign Communication From a Counterpart Application, European Application No. 13885076.3, Extended European Search Report dated Apr. 25, 2016, 8 pages.
Partial English Translation and Abstract of Chinese Patent Application No. CN202733845, Dec. 8, 2016, 5 pages.
Foreign Communication From a Counterpart Application, Chinese Application No. 201310196273.3, Chinese Office Action dated Nov. 2, 2016, 10 pages.

* cited by examiner

HEAT DISSIPATION SYSTEM FOR OPTICAL MODULE

CROSS-REFERENCE TO RELATED APPLICATIONS

This application is a continuation of International Application No. PCT/CN2013/086195, filed on Oct. 30, 2013, which claims priority to Chinese Patent Application No. 201310196273.3, filed on May 24, 2013, both of which are hereby incorporated by reference in their entireties.

TECHNICAL FIELD

The present disclosure relates to communication fittings technologies, and in particular, to a heat dissipation system for an optical module.

BACKGROUND

An optical module is an integrated module that converts an optical signal into an electrical signal and/or converts an electrical signal into an optical signal. The optical module is generally mounted and applied on a printed circuit board, and plays an important role in a process of optical fiber communication in the communications field.

The optical module includes an optoelectronic device, a functional circuit, and an optical interface, where the optoelectronic device and the functional circuit are used collaboratively to complete conversion between optical and electrical signals; and the optical interface is generally fixed on an end face of a face plate of the printed circuit board, and is configured to connect to an optical fiber. However, in a work process of the optical module, the optical module generates a large amount of heat, and a laser that is of the optical module and used to generate or receive an optical signal has a relatively strict requirement on a temperature. Therefore, to ensure that optical communication is performed normally, the heat generated by the optical module needs to be dissipated in time. The laser in the optical module is a major power consumption device in the optical module, and in particular, a laser for generating an optical signal, that is, an optical signal transmit laser, generates the largest amount of heat.

In the prior art, a manner that multiple optical modules are disposed on a same plane is adopted, and heat is dissipated by using a heat sink. When the multiple optical modules are disposed on a same plane on the printed circuit board, heat generated by the optical modules passes from an upper end to a lower end, causing a phenomenon of heat accumulation, which is easy to cause an optical module at the lower end to be severely damaged due to an excessively high temperature in a work environment. A manner adopted in the prior art is that all optical modules are covered by the heat sink, and the heat sink makes temperatures of the optical modules even and equal, which diminishes the phenomenon of the heat accumulation, thereby achieving a heat dissipation effect for the optical modules. However, in this manner, the phenomenon of the heat accumulation still exists, and the heat dissipation effect for the optical modules is not desirable, which makes the optical modules easy to be damaged.

SUMMARY

Embodiments of the present disclosure provide a heat dissipation system for an optical module, to improve the heat dissipation efficiency of the optical module.

To achieve the foregoing objective, the embodiments of the present disclosure use the following technical solutions.

A heat dissipation system for an optical module includes a circuit card on which at least one optical module is mounted, where the optical module includes a housing and a laser disposed inside the housing; a first heat dissipation apparatus is fixedly disposed on the circuit card; a heat dissipation window is provided in an area that is above the laser and on the housing of the optical module; and the first heat dissipation apparatus performs heat dissipation on the heat dissipation window.

There are multiple types of structures for heat dissipation structures provided in the embodiments of the present disclosure, and one of the structures is that the heat dissipation window is a heat sink fin in a cross structure, where the heat sink fin includes multiple first toothed bars horizontally disposed at intervals and multiple second toothed bars vertically disposed at intervals; and the second toothed bars are located on surfaces of the first toothed bars, and the second toothed bars and the first toothed bars are disposed in a cross manner.

Preferably, the multiple first toothed bars are disposed parallel to each other; and the multiple second toothed bars are disposed parallel to each other.

There are multiple types of structures for the heat dissipation apparatus provided in the embodiments of the present disclosure, and one of the structures is that the first heat dissipation apparatus is a piezoelectric film fan, where the piezoelectric film fan includes a hollow body, a film, and a piezoelectric plate, and the piezoelectric plate and the film are fixedly connected to form a piezoelectric structure; the piezoelectric structure is disposed inside a hollow cavity of the body, and a gap exists between the piezoelectric structure and an inner wall of the body; a first opening is provided on a surface on a side, corresponding to the piezoelectric plate, of the body; a nozzle is provided on a surface, opposite to the first opening, of the body, and the nozzle faces to the heat dissipation window; and the piezoelectric plate is electrically connected to an alternating current.

To prevent the film from being damaged, a second opening whose size is close to that of the nozzle is provided on the film at a position opposite to the nozzle.

Further, a quantity of nozzles of the first heat dissipation apparatus is equal to a quantity of the optical modules.

There are multiple positions for mounting the heat dissipation apparatus provided in the embodiments of the present disclosure, and one of the positions is that the first heat dissipation apparatus is disposed on a face plate of the circuit card.

There are multiple positions for mounting the heat dissipation apparatus provided in the embodiments of the present disclosure, and one of the positions is that the first heat dissipation apparatus is fixed through clamping on the circuit card.

To fully ensure normal work of the optical module, the heat dissipation system for an optical module further includes a second heat dissipation apparatus, where the second heat dissipation apparatus is disposed on the housing of the optical module, and is located on a side edge of the heat dissipation window.

The second heat dissipation apparatus is a heat sink.

In the heat dissipation system for an optical module provided in the embodiments of the present disclosure, a first heat dissipation apparatus is fixedly disposed on a circuit card, and in addition, a heat dissipation window is provided on a housing of the optical module, and the heat dissipation window is located above a laser area, in which a large amount of heat is generated, inside the housing, such that heat dissipation is performed on the heat dissipation window using the first heat dissipation apparatus, and heat generated during work of the optical module can be dissipated in a timely time at the heat dissipation window using the first heat dissipation apparatus, thereby improving heat dissipation efficiency of the optical module.

BRIEF DESCRIPTION OF DRAWINGS

To describe the technical solutions in the embodiments of the present disclosure more clearly, the following briefly introduces the accompanying drawings required for describing the embodiments.

DESCRIPTION OF EMBODIMENTS

The following clearly describes the technical solutions in the embodiments of the present disclosure with reference to the accompanying drawings in the embodiments of the present disclosure.

Figure 1:
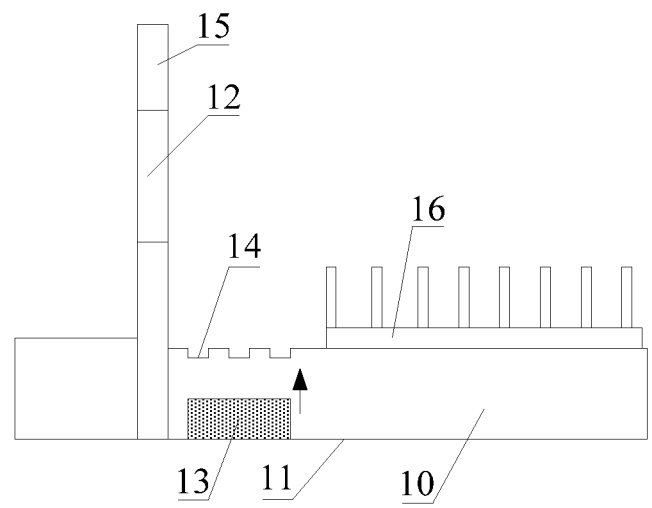
FIG. 1 is a schematic structural diagram of a heat dissipation system for an optical module according to an embodiment of the present disclosure.
Figure 2:
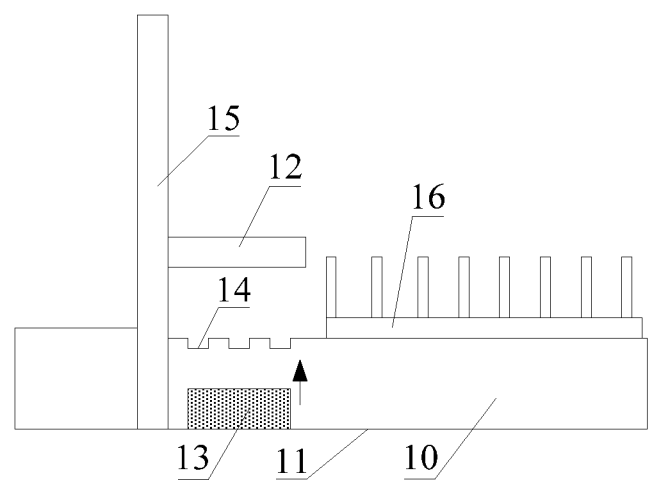
FIG. 2 is a schematic structural diagram of another heat dissipation system for an optical module according to an embodiment of the present disclosure.

The present disclosure provides a heat dissipation system for an optical module, as shown in FIG. 1 or FIG. 2, including a circuit card on which at least one optical module 10 is mounted, where the optical module 10 includes a housing 11 and a laser 13 disposed inside the housing 11. A first heat dissipation apparatus 12 is fixedly disposed on the circuit card. A heat dissipation window 14 is provided in an area that is above the laser 13 and on the housing 11 of the optical module. The first heat dissipation apparatus 12 performs heat dissipation on the heat dissipation window 14.

In the heat dissipation system for an optical module provided in the embodiments of the present disclosure, a first heat dissipation apparatus is fixedly disposed on a circuit card, and in addition, a heat dissipation window is provided on a housing of the optical module, and the heat dissipation window is located above a laser area, in which a large amount of heat is generated, inside the housing, such that heat dissipation is performed on the heat dissipation window using the first heat dissipation apparatus, and heat generated during work of the optical module can be dissipated in a timely manner at the heat dissipation window using the first heat dissipation apparatus, thereby improving heat dissipation efficiency of the optical module.

The above of the laser 13 is a direction indicated by arrows in FIG. 1 and FIG. 2.

Figure 3A:
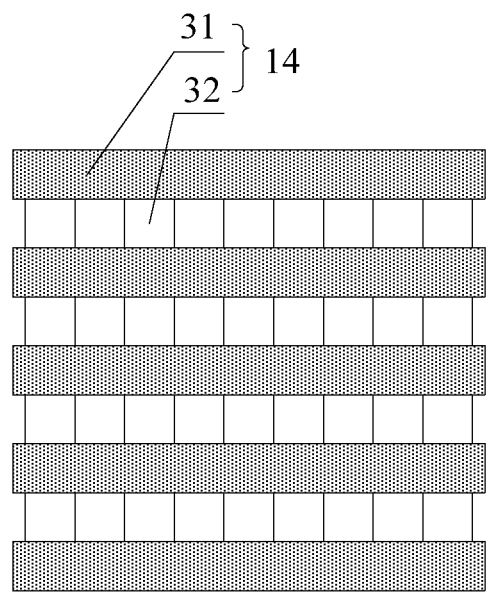
FIG. 3A is a top view of a heat dissipation window according to an embodiment of the present disclosure.
Figure 3B:
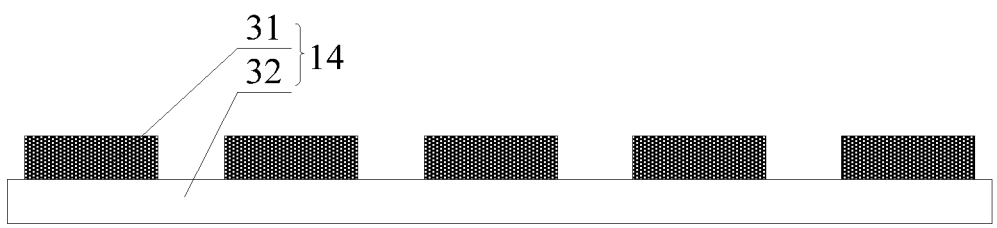
FIG. 3B is a side view of a heat dissipation window according to an embodiment of the present disclosure.

In the heat dissipation system for an optical module described in the foregoing embodiment, as shown in FIG. 3A and FIG. 3B, a heat dissipation window 14 may be a heat sink fin in a cross structure, where the heat dissipation window 14 includes multiple first toothed bars 31 horizontally disposed at intervals and multiple second toothed bars 32 vertically disposed at intervals. The second toothed bars 32 are located on surfaces of the first toothed bars 31, and the second toothed bars 32 and the first toothed bars 31 are disposed in a cross manner. The heat sink fin in the cross structure can increase an area of heat dissipation for the optical module 10, thereby improving the heat dissipation efficiency of the optical module.

In the heat sink fin in the cross structure shown in FIG. 3A and FIG. 3B, when the heat dissipation is performed on the heat sink fin by an apparatus by ejecting gas, the multiple second toothed bars 32 vertically disposed at intervals are fixed through insertion on the housing of the optical module 10, and the multiple second toothed bars 32 are disposed parallel to each other, such that multiple parallel vertical paths can be formed in this area of the housing of the optical module 10, and then are fixedly connected on surfaces of the vertical second toothed bars 32 through the horizontal first toothed bars 31. In addition, the multiple first toothed bars 31 are disposed parallel to each other, and are arranged in a cross manner together with the vertical second toothed bars 32, to finally form multiple parallel vertical wind discharge paths, such that gas enters the wind discharge paths from gaps between the horizontal first toothed bars 31 and the vertical second toothed bars 32, and the gas flows along the wind discharge paths, thereby avoiding a problem that a heat dissipation effect is compromised due to rebound of gas ejected head-on.

The first toothed bars 31 and the second toothed bars 32 in the heat sink fin are pluggable, which facilitates adjustment or change of a structure of the heat dissipation window 14, such that a structure with a best heat dissipation effect can be obtained through multiple tests. In addition, the first toothed bars 31 may be mounted first, and then the second toothed bars 32 may be mounted on the surfaces of the first toothed bars 31.

Figure 4:
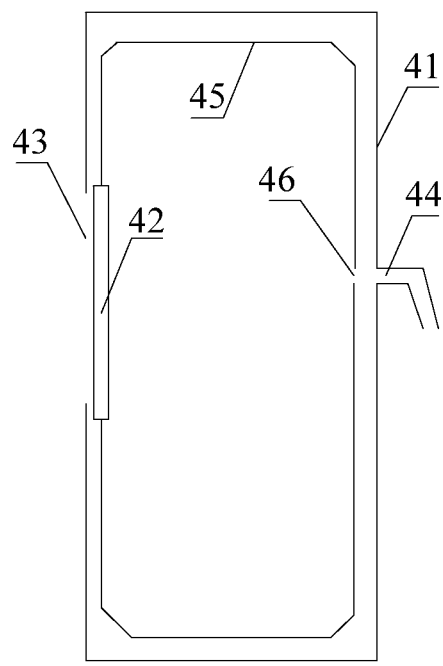
FIG. 4 is a schematic structural diagram of a first heat dissipation apparatus according to an embodiment of the present disclosure.

In the heat dissipation system for an optical module described in the foregoing embodiment, as shown in FIG. 4, a first heat dissipation apparatus 12 may be a piezoelectric film fan, where the piezoelectric film fan includes a hollow body 41, a film 45, and a piezoelectric plate 42, and the piezoelectric plate 42 and the film 45 are fixedly connected to form a piezoelectric structure. The piezoelectric structure is disposed inside a hollow cavity of the body 41, and a gap exists between the piezoelectric structure and an inner wall of the body 41. A first opening 43 is provided on a surface on a side, corresponding to the piezoelectric plate 42, of the body 41. A nozzle 44 is provided on a surface, opposite to the first opening 43, of the body 41, and the nozzle 44 faces to the heat dissipation window 14. The piezoelectric plate 42 is electrically connected to an alternating current.

In FIG. 4, the piezoelectric plate 42 is electrically connected to the alternating current, enabling the piezoelectric plate 42 to vibrate with frequency changes of the alternating current, thereby driving the film 45 that is fixedly connected to the piezoelectric plate 42 to vibrate together. In the vibration process, when the piezoelectric plate 42 or the film 45 presses against the inner wall of the body 41 to close the first opening 43, an internal pressure of the body 41 decreases, and is lower than the ambient pressure. When the piezoelectric plate 42 vibrates to make the first opening 43 open, due to a pressure difference between internal and external environments of the body 41, external air flows into the body through the first opening 43, and at the same time the air that flows in circulates along a gap between the piezoelectric structure and the inner wall of the body 41, and finally flows out from the nozzle 44. In an implementation operation, reducing the gap between the piezoelectric structure and the inner wall of the body 41 can increase the speed of the gas circulation, and make the gas flow out from the nozzle 44 in a form of ejection. The nozzle 44 faces to the heat dissipation window 14, such that the ejected gas can speed up the heat dissipation of the optical module 10, thereby improving the heat dissipation efficiency. In addition, the piezoelectric film fan is of a simple structure, effectively reducing manufacturing costs.

The nozzle 44 in FIG. 4 is in an L-shaped structure, and this structure applies to a case shown in FIG. 1 in which the first heat dissipation apparatus 12 is disposed on a face plate 15. In a case shown in FIG. 2 in which the first heat dissipation apparatus 12 is fixed through clamping on the circuit card, because the nozzle 44 exactly faces to the heat dissipation window 14, no change needs to be made to the structure of the nozzle. When the nozzle 44 is in the L-shaped structure, the gas can be ejected more quickly to a surface of the heat dissipation window 14 by increasing the length of a gas circulation track. When the heat dissipation window 14 is the heat sink fin, the gas can circulate along the wind discharge paths, dissipating heat of the optical module 10 thoroughly.

In the heat dissipation system for an optical module described in the foregoing embodiment, as shown in FIG. 4, a second opening 46 whose size is close to that of the nozzle 44 may be provided on the film 45 at a position opposite to the nozzle 44. In a process in which the piezoelectric plate 42 vibrates to generate the ejected gas, the vibration of the piezoelectric plate 42 makes the internal pressure of the body 41 sometimes high and sometimes low, and therefore at the moment when the internal pressure of the body 41 changes, a great impact is easily generated upon the film, thereby damaging the film 45. Therefore, the second opening 46 is provided on the film 45 to make the inside of the film 45 connected with the inside of the body 41, and then an internal pressure of the film 45 is the same as the internal pressure of the body 41, thereby preventing the film 45 from being damaged.

Figure 5:
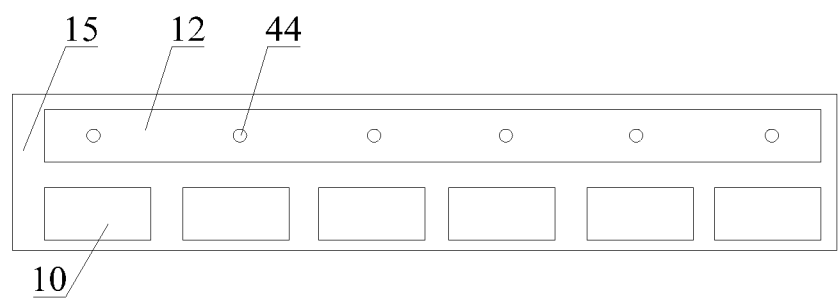
FIG. 5 is a side view of still another heat dissipation system for an optical module according to an embodiment of the present disclosure.

As shown in FIG. 5, a quantity of nozzles 44 of the first heat dissipation apparatus 12 may be equal to a quantity of optical modules 10. Generally, multiple optical modules 10 need to be used in one circuit card, for example, in an optoelectronic switch. In this case, a first heat dissipation apparatus 12 may be disposed along the length direction of a face plate 15, and in addition, heat dissipation processing needs to be performed on the optical modules 10. Then the quantity of the nozzles 44 needs to be set according to the quantity of the optical modules 10, such that the nozzles 44 separately face heat dissipation windows 14 of the optical modules 10, thereby ensuring that a phenomenon of heat accumulation does not occur on the optical modules 10.

In the heat dissipation system for an optical module described in the foregoing embodiment, as shown in FIG. 1, the first heat dissipation apparatus 12 may be disposed on the face plate 15 of the circuit card. Generally, an optical interface of the optical module 10 is fixedly disposed on an end face of the face plate 15, and along the width direction of the face plate 15, the height of the optical interface is about 10 millimeters. Then on a side on which the optical interface is located on the face plate 15, there is sufficient space for mounting the first heat dissipation apparatus 12.

The first heat dissipation apparatus 12 is fixedly mounted on the face plate 15 directly, which is easy to dismount and proper in layout, thereby simplifying a processing technique. In addition, because the first heat dissipation apparatus 12 is not conducted, the first heat dissipation apparatus 12 has a very desirable function of blocking an electromagnetic wave generated by another part on the circuit card, thereby preventing transmission of the electromagnetic wave, and avoiding a problem such as interference from the electromagnetic wave.

As shown in FIG. 2, the first heat dissipation apparatus 12 may also be fixed through clamping on the circuit card. Compared with that the first heat dissipation apparatus 12 is fixedly disposed on the face plate 15 in FIG. 1, in the manner shown in FIG. 2, a position of the first heat dissipation apparatus 12 relative to the heat dissipation window 14 on the optical module 10 can be conveniently adjusted, and therefore, the first heat dissipation apparatus 12 can be adjusted to a best position through multiple tests, to improve the heat dissipation efficiency of the optical module 10.

In the implementation operation, the first heat dissipation apparatus 12 may be fixed through clamping on the face plate, or may be fixed on a heat sink, or may be fixed through clamping on another structural part on the circuit card.

In the heat dissipation system for an optical module described in the foregoing embodiment, as shown in FIG. 1 or FIG. 2, the heat dissipation system for an optical module may further include a second heat dissipation apparatus 16, where the second heat dissipation apparatus 16 is disposed on the housing of the optical module 10, and is located on a side edge of the heat dissipation window 14. The second heat dissipation apparatus 16 may be a heat sink or another heat dissipation apparatus. Through a joint action of the second heat dissipation apparatus 16 and the first heat dissipation apparatus 12, the heat dissipation effect for the optical module 10 can be further effectively improved. In addition, when the first heat dissipation apparatus 12 cannot work normally due to some faults, the heat generated by the optical module 10 can still be dissipated using the second heat dissipation apparatus 16, such that the heat of the optical module 10 is dissipated in a timely manner, ensuring normal work of the optical module 10.

The foregoing descriptions are merely implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A heat dissipation system for an optical module, comprising:
   at least one optical module mounted on a circuit card, wherein the optical module comprises a housing and a laser disposed inside the housing; and
   a first heat dissipation apparatus is fixedly disposed on a same side of the circuit card as the at least one optical module; and
   a heat dissipation window component located between the first heat dissipation apparatus and the at least one optical module, wherein the heat dissipation window component is coupled to the housing above the laser of the optical module, and wherein the first heat dissipation apparatus performs heat dissipation on the heat dissipation window component.

2. The heat dissipation system for the optical module according to claim 1, wherein the heat dissipation window component is a heat sink fin in a cross structure, wherein the heat sink fin comprises multiple first toothed bars horizontally disposed at intervals and multiple second toothed bars vertically disposed at intervals, wherein the second toothed bars are located on surfaces of the first toothed bars, and wherein the second toothed bars and the first toothed bars are disposed in a cross manner.

3. The heat dissipation system for the optical module according to claim 2, wherein the multiple first toothed bars are disposed parallel to each other, and wherein the multiple second toothed bars are disposed parallel to each other.

4. The heat dissipation system for the optical module according to claim 2, wherein the first heat dissipation apparatus is a piezoelectric film fan, wherein the piezoelectric film fan comprises a hollow body, a film, and a piezoelectric plate, wherein the piezoelectric plate and the film are fixedly connected to form a piezoelectric structure, wherein the piezoelectric structure is disposed inside a hollow cavity of the body, wherein a gap exists between the piezoelectric structure and an inner wall of the body, wherein a first opening is provided on a surface on a side, corresponding to the piezoelectric plate, of the body, wherein a nozzle is provided on a surface, opposite to the first opening, of the body, wherein the nozzle is directed towards the heat dissipation window component, and wherein the piezoelectric plate is electrically connected to an alternating current.

5. The heat dissipation system for the optical module according to claim 1, wherein the first heat dissipation apparatus is a piezoelectric film fan, wherein the piezoelectric film fan comprises a hollow body, a film, and a piezoelectric plate, wherein the piezoelectric plate and the film are fixedly connected to form a piezoelectric structure, wherein the piezoelectric structure is disposed inside a hollow cavity of the body, wherein a gap exists between the piezoelectric structure and an inner wall of the body, wherein a first opening is provided on a surface on a side, corresponding to the piezoelectric plate, of the body, wherein a nozzle is provided on a surface, opposite to the first opening, of the body, wherein the nozzle is directed towards the heat dissipation window component, and wherein the piezoelectric plate is electrically connected to an alternating current.

6. The heat dissipation system for the optical module according to claim 5, wherein a second opening whose size is close to that of the nozzle is provided on the film at a position opposite to the nozzle.

7. The heat dissipation system for the optical module according to claim 5, wherein a quantity of nozzles of the first heat dissipation apparatus is equal to a quantity of the optical modules.

8. The heat dissipation system for the optical module according to claim 5, wherein the first heat dissipation apparatus is disposed on a face plate of the circuit card.

9. The heat dissipation system for the optical module according to claim 5, wherein the first heat dissipation apparatus is fixed through clamping on the circuit card.

10. The heat dissipation system for the optical module according to claim 1, further comprising a second heat dissipation apparatus disposed on the housing of the optical module and is located on a side edge of the heat dissipation window component.

11. The heat dissipation system for the optical module according to claim 10, wherein the second heat dissipation apparatus is a heat sink.

* * * * *